(12) United States Patent
Sivertsen

(10) Patent No.: US 7,062,844 B2
(45) Date of Patent: Jun. 20, 2006

(54) APPARATUS FOR IDENTIFYING AND MOUNTING PRINTED CIRCUIT BOARDS

(75) Inventor: Clas Gerhard Sivertsen, Lilburn, GA (US)

(73) Assignee: American Megatrends, Inc., Norcross, GA (US)

(*) Notice: Subject to any disclaimer, the term of this patent is extended or adjusted under 35 U.S.C. 154(b) by 271 days.

(21) Appl. No.: 10/100,367

(22) Filed: Mar. 18, 2002

(65) Prior Publication Data

US 2003/0174476 A1    Sep. 18, 2003

(51) Int. Cl.
*B23P 19/00* (2006.01)
*H05K 13/04* (2006.01)

(52) U.S. Cl. .................. 29/729; 29/701; 29/721; 29/832; 361/760

(58) Field of Classification Search .......... 29/729, 29/760, 832, 281.1, 701, 709, 712, 720, 721, 29/739, 759; 174/250–267; 361/760, 784–792, 361/796, 797, 801–803, 681; 439/490; 269/21, 269/289 R, 903

See application file for complete search history.

(56) References Cited

U.S. PATENT DOCUMENTS

| | | | | |
|---|---|---|---|---|
| 3,372,455 A | * | 3/1968 | Howie | 29/701 |
| 3,667,104 A | * | 6/1972 | Chamillard et al. | 29/721 |
| 3,731,363 A | * | 5/1973 | Hall et al. | 29/721 |
| 4,102,568 A | * | 7/1978 | Miyagi | 29/739 |
| 4,677,428 A | * | 6/1987 | Bartholow | 345/180 |
| 4,866,837 A | * | 9/1989 | Heissenberger et al. | 29/741 |
| 5,886,338 A | * | 3/1999 | Arackellian et al. | 235/472.01 |
| 5,914,698 A | * | 6/1999 | Nicholson et al. | 345/1.3 |

\* cited by examiner

*Primary Examiner*—Minh Trinh
*Assistant Examiner*—Donghai D. Nguyen
(74) *Attorney, Agent, or Firm*—Hope Baldauff Hartman, LLC

(57) ABSTRACT

An apparatus is provided for identifying one or more mounting locations for mounting a printed circuit board or other type of electronic device, including a mounting surface and one or more light sources mounted on the mounting surface. The light sources are located at positions corresponding to the mounting locations for mounting the printed circuit board or other type of electronic component. When illuminated, the light sources identify one or more mounting locations. The mounting locations are defined by mounting patterns corresponding to the mounting locations for a given type of printed circuit board or other electronic component. The light sources are illuminated so that only light sources corresponding to mounting locations defined by a particular mounting pattern are illuminated.

6 Claims, 9 Drawing Sheets

APPARATUS FOR IDENTIFYING AND MOUNTING PRINTED CIRCUIT BOARDS

TECHNICAL FIELD

The present invention relates generally to the field of assembling electronic components and, more specifically, to the field of physically mounting printed circuit boards or other types of electronic components.

BACKGROUND OF THE INVENTION

Equipment racks are utilized to house a variety of different types of electronic equipment. For instance, a rack-mount chassis installed within a rack may be utilized to hold server computers, mass storage devices, telecommunications equipment, and a wide variety of other types of electronic equipment. The Electronic Industry Association's ("EIA") standard EIA-310-D sets forth the standard dimensions and specifications for cabinets, racks, panels, and associated equipment utilized in standard-sized racks.

In order to accommodate the many different types of equipment that may be mounted within a particular rack-mount chassis, the rack-mount chassis may have a large number of holes drilled in its bottom panel. These holes may be drilled in different mounting patterns according to the mounting requirements of different types of equipment. For instance, different types of printed circuit board standards exist that have different types of mechanical mounting requirements.

In order for a rack-mount chassis to support the mounting of each different type of printed circuit board, different mounting patterns need to be drilled into the bottom panel of the rack-mount chassis. In this manner, a single rack-mount chassis may be utilized to accommodate the mounting of different board types. The mounting patterns for the different board types are specified by their respective specifications, such as the ATX standard, the Baby AT standard, or the full AT standard. Other standards may also be utilized for mounting sleds for holding mass storage devices and other types of equipment. When a rack-mount chassis includes mounting holes for a variety of board or equipment types, the mounting pattern in the rack-mount chassis is often referred to as a "universal" mounting pattern.

Although a universal mounting pattern allows many different types of equipment to be mounted within a rack-mount chassis, these universal mounting patterns may also cause difficulties. In particular, the many different holes in the rack-mount chassis that comprise a universal mounting pattern may make it very difficult for a machine or a human installer to determine which holes correspond to the mounting pattern for a piece of equipment to be installed. For instance, a human installer may need to identify six or eight holes from as many as 25 or 30 holes in a universal mounting pattern. This can be difficult for a human or computer installer to accomplish.

The difficulty in locating the appropriate mounting holes for a particular piece of equipment can result in serious inefficiency on the assembly line and cause the assembly of a rack-mount chassis to be more expensive. This is particularly true if a human assembler or a machine assembler accidentally places mounting hardware in the wrong holes. This type of error may not be detected until the assembler actually tries to install the printed circuit board or other piece of equipment into the rack-mount chassis. At that time, the assembler would need to remove the improperly placed mounting hardware, identify the correct holes for the mounting hardware, and then reinstall the mounting hardware. The reduced efficiency caused by such accidental misplacement of mounting hardware can become extremely expensive over time and substantially increase the manufacturing costs for the complete rack-mount chassis.

Therefore, in light of the above, there is a need for a method and apparatus for mounting printed circuit boards and other types of components within a rack-mount chassis that can correctly identify the particular mounting holes for a specified mounting pattern. Moreover, there is a need for a method and apparatus to assist in mounting printed circuit boards or other electronic components that can improve installation efficiency and reduce the cost of manufacturing the complete rack-mount chassis assembly.

SUMMARY OF THE INVENTION

Embodiments of the present invention solve the above-described problems by providing a method and apparatus for mounting printed circuit boards or other electronic components that allow a human or machine installer to more easily identify the mounting holes corresponding to a particular hardware mounting pattern. Moreover, various embodiments of the present invention allow a human or machine installer to quickly and easily identify the locations for mounting hardware, thereby reducing the chances for error and improving installation efficiency.

According to one actual embodiment of the present invention, an apparatus is provided for identifying one or more mounting locations for mounting a printed circuit board or other type of electronic device. The apparatus includes a mounting surface and one or more light sources mounted on the mounting surface. The light sources are located at positions corresponding to the mounting locations for mounting the printed circuit board. When illuminated, the light sources identify one or more mounting locations for the printed circuit board.

According to an embodiment of the invention, the mounting locations are defined by mounting patterns. A mounting pattern corresponds to the mounting locations for a given type of printed circuit board or other electronic component. In this embodiment, the light sources may be illuminated so that only light sources corresponding to mounting locations defined by a particular mounting pattern are illuminated. In this manner, the apparatus may be configured to identify mounting locations defined by mounting patterns for many different types of printed circuit boards or other electronic devices.

In order to control the illumination of the light sources, a control means may be provided that includes a memory for storing data identifying the light sources to be illuminated when a particular mounting pattern is selected. The control means may also include circuitry and other electronic components necessary to illuminate the light sources. According to one embodiment of the invention, a selector means is also provided that is connected to the control logic and that allows a user to select from one or more selectable positions corresponding to different mounting patterns. In this manner, the selection of different mounting patterns for different types of printed circuit boards or other electronic components may be made by a user with the selector means. Selection of the appropriate mounting pattern may also be made under computer control.

According to another embodiment of the present invention, a method is provided for generating an illuminated mounting pattern identifying one or more mounting locations for mounting a printed circuit board or other electronic component. The method provided according to this embodiment of the invention comprises receiving the identity of a selected mounting pattern, retrieving the identities of one or more light sources that should be illuminated to identify the mounting locations for the selected mounting pattern, and illuminating the identified light sources. According to this embodiment of the invention, the identity of the selected mounting pattern may be received at a control means from a selector means, such as a selector knob.

If the selector means is utilized to select a second mounting pattern, the method may also include retrieving the identities of one or more light sources that should be illuminated to identify the mounting locations for the second selected mounting pattern, extinguishing the light sources illuminated for identifying the mounting locations for the previously selected mounting pattern, and illuminating the light sources for identifying the mounting locations for the second selected mounting pattern. In this manner, any number of mounting patterns may be selectively and sequentially displayed.

According to yet another embodiment of the present invention, a method is provided for mounting a printed circuit board or other type of electronic component on a mounting surface. According to this embodiment of the present invention, the printed circuit board includes one or more mounting points and the mounting surface includes one or more mounting holes. The method provided according to this embodiment of the present invention comprises illuminating light sources at locations corresponding to the locations of the mounting points on the printed circuit board or other type of electronic component and positioning the mounting surface so that the illuminated light sources may be detected through the mounting holes in the mounting surface. Once the mounting surface has been positioned in this manner, the illuminated light sources are detected through the mounting holes in the mounting surface. Based on the locations of the detected light sources, mounting hardware may be installed in each of the holes in the mounting surface through which an illuminated light source is detected.

According to another embodiment of the present invention, a magnetic sheet may be installed over the mounting hardware so that the mounting hardware is removably attached to the mounting surface. With the magnetic sheet holding the mounting hardware in place, the printed circuit board or other type of electronic component may be affixed to the mounting surface with the mounting hardware. Once the printed circuit board or other type of electronic component has been affixed to the mounting surface, the magnetic sheet may be removed.

Other aspects of the invention in its various embodiments will become apparent from the detailed description that follows.

DETAILED DESCRIPTION OF AN ILLUSTRATIVE EMBODIMENT

In the following detailed description, reference is made to the accompanying drawings that form a part hereof, and in which is shown by way of illustration specific embodiments or examples. These embodiments may be combined, other embodiments may be utilized, and structural, logical, and electronic changes may be made without departing from the spirit and scope of the present invention. The following detailed description is, therefore, not to be taken in a limiting sense, and the scope of the present invention is defined by the appended claims and their equivalents.

Figure 1:
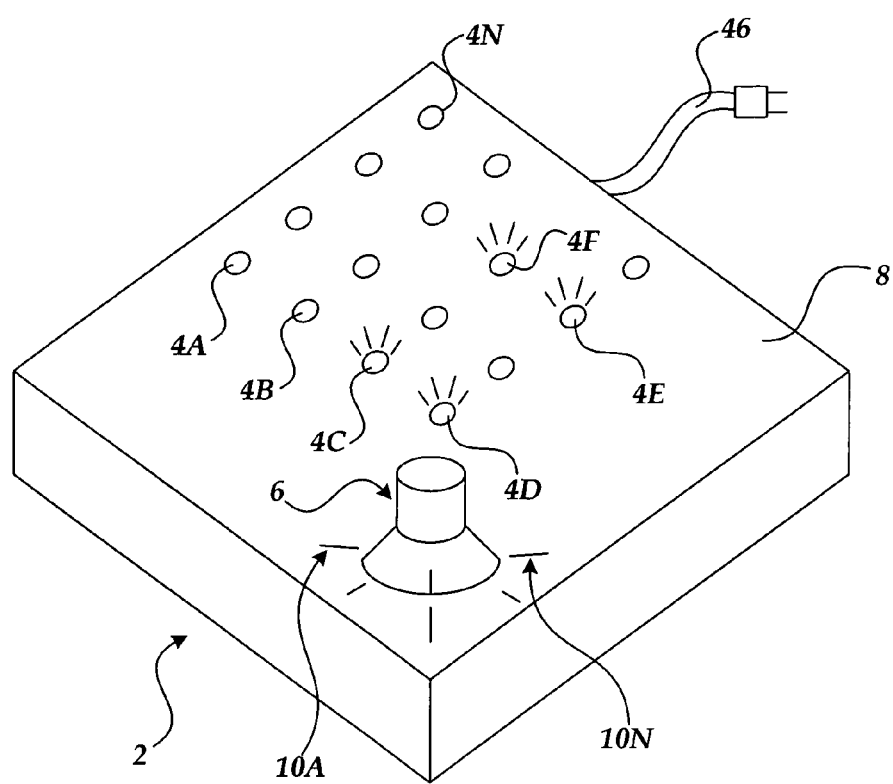
FIG. 1 is an isometric view of an apparatus provided according to one embodiment of the present invention for identifying mounting locations for a printed circuit board or other type of electronic device.

Referring now to FIG. 1, one illustrative embodiment of the present invention will be described. As shown in FIG. 1, an apparatus 2 is provided for assisting in the identification of mounting locations for mounting a printed circuit board or other type of electronic apparatus. As shown in FIG. 1, the apparatus 2 comprises a mounting surface 8 upon which one or more light sources 4A–4N may be mounted. The light sources 4A–4N may comprise light-emitting diodes, light bulbs, or other types of light-emitting components known to those skilled in the art. As will be described in greater detail below, the light sources 4A–4N may be illuminated in a manner so that only light sources corresponding to mounting locations defined by a mounting pattern are illuminated.

As shown in FIG. 1, the apparatus 2 also comprises a selector means 6 for selecting one of a number of positions 10A–10N. According to one embodiment of the invention, the selector means 6 comprises a selector knob that may be utilized to select one from a group of mounting patterns. In order to make such a selection, the apparatus 2 may include positions 10A–10N for the selector means 6. Utilizing the selector means 6, a user may manually select an illuminated mounting pattern to be displayed by the light sources 4A–4N. According to alternate embodiments of the present invention, the particular mounting pattern illuminated by the light sources 4A–4N may be selected by computer or other means.

As will be described in greater detail below, the apparatus 2 also comprises a control means for controlling the illumination of the light sources 4A–4N. The selector means 6 may be coupled to the control means. Additionally, a power source 44 may be provided to power the operation of the apparatus 2. In one embodiment of the present invention, a power cord 46 is provided along with an internal power supply to power the operation of the apparatus 2 using standard alternating current ("AC"). Alternatively, a rechargeable power source, such as rechargeable batteries, may be utilized to power the operation of the apparatus 2 without the use of a power cord 46.

Figure 2:
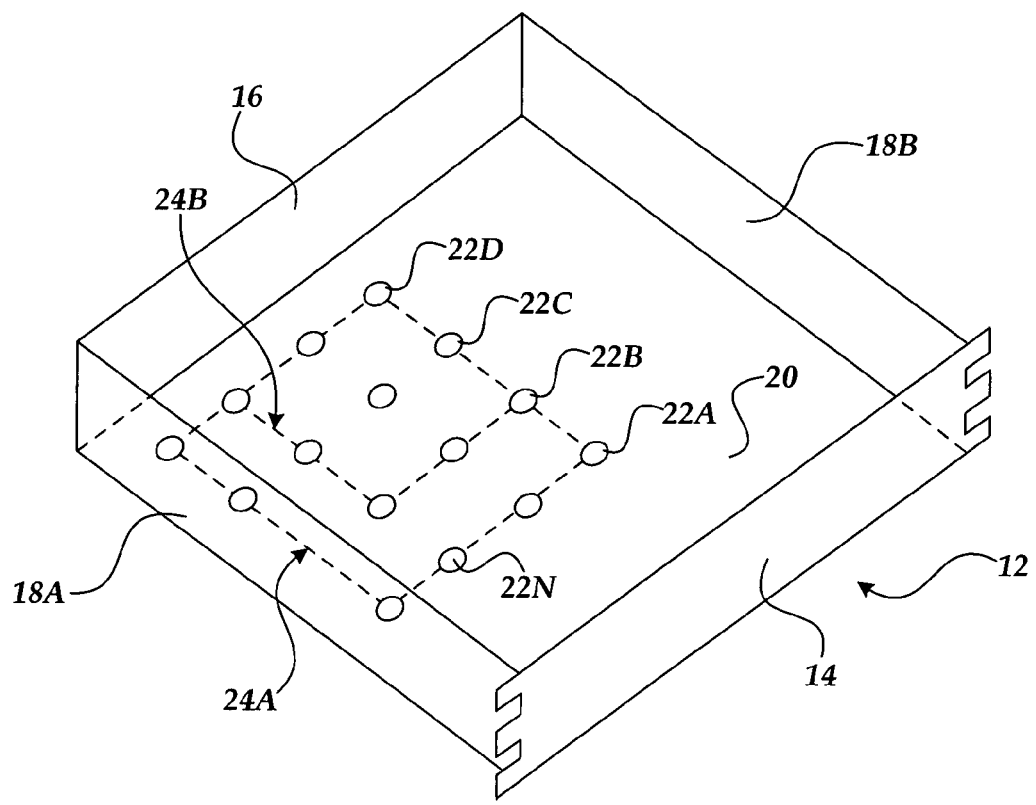
FIG. 2 is an isometric view of a rack-mount chassis including one or more mounting patterns utilized in one embodiment of the present invention.

Referring now to FIG. 2, a block diagram will be described showing a rack-mount chassis 12 utilized in one embodiment of the present invention. As will be described in greater detail below, the apparatus 2 described above with reference to FIG. 1 is utilized to identify mounting locations 22A–22N for mounting a printed circuit board or other type of electronic component. According to one embodiment of the invention, the apparatus 2 may be utilized to identify mounting locations on a rack-mount chassis 12 as shown in FIG. 2. The rack-mount chassis 12 comprises a front panel 14, a back panel 16, and side panels 18A–18B. One type of standard rack-mount chassis 12 is described in the EIA standard EIA-310-D. This type of rack-mount chassis is well known to those skilled in the art.

In order to accommodate the mounting of printed circuit boards and other types of electronic components, the rack-mount chassis 12 may include one or more mounting locations 22A–22N. In the embodiment described herein, the mounting locations 22A–22N comprise mounting holes for receiving mounting hardware 28 for attaching a printed circuit board or other type of electronic component. Additionally, the mounting locations 22A–22N may be arranged according to one or more mounting patterns. Mounting patterns comprise a physical layout of mounting locations corresponding to a particular type of printed circuit board or other electronic component. For instance, the mounting pattern 24A may correspond to a certain type of printed circuit board and the mounting pattern 24B may correspond to another type of printed circuit board. Mounting patterns 24A and 24B may include mounting locations 22A–22N in common and may have mounting locations 22A–22N that are different. As will be described in greater detail below, the apparatus 2 may be utilized by a human or machine installer to identify more easily the mounting locations 22A–22N corresponding to a particular mounting pattern, such as the mounting patterns 24A or 24B.

Figure 3:
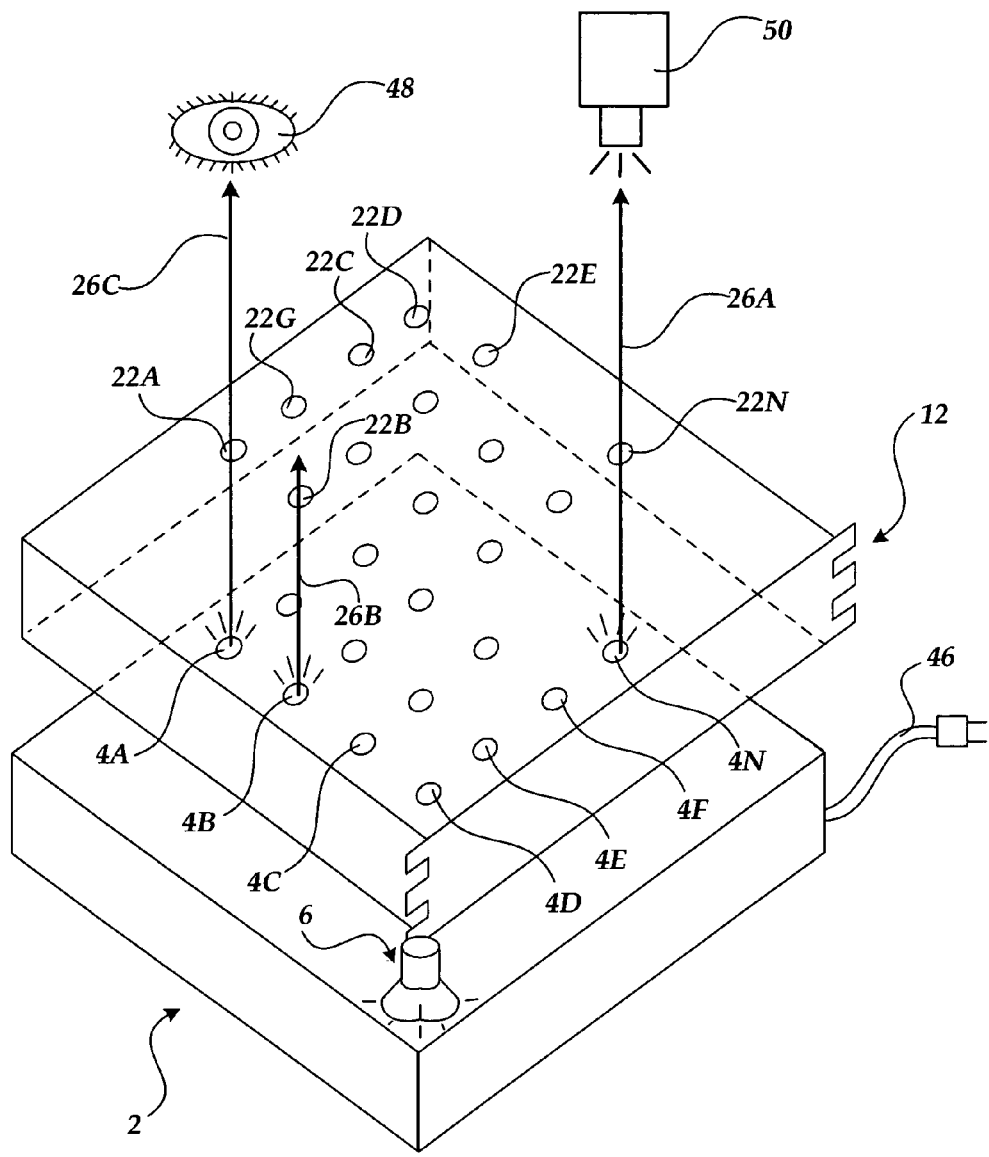
FIG. 3 is an isometric view illustrating a mode of use for an apparatus provided according to one embodiment of the present invention.

Referring now to FIG. 3, a mode of use for the apparatus 2 according to one embodiment of the present invention will be described. As shown in FIG. 2, the apparatus 2 may be utilized to identify mounting locations 22A–22N on the rack-mount chassis 12 for installing mounting hardware 28. According to one embodiment of the present invention, power is provided to the apparatus 2 through the power cord 46 or other power means, such as rechargeable batteries. Once the apparatus 2 has been powered on, the selector means 6 may be utilized to select the identity of a particular mounting pattern. Once the mounting pattern has been identified, the apparatus 2 retrieves the identities of the light sources 4A–4N that should be illuminated to identify the mounting locations 22A–22N for the selected mounting pattern and illuminates the appropriate light sources 4A–4N. For instance, as shown in FIG. 3, light sources 4A, 4B, and 4N have been illuminated, thereby providing light beams 26C, 26B, and 26A, respectively. Alternatively, the light sources 4A–4N may provide non-visible light that may be detected by means other than the human eye, such as the computer eye 50.

Once the light sources 4A–4N have been illuminated, the rack-mount chassis 12 may be positioned so that the illuminated light sources 4A–4N can be detected through the mounting locations 22A–22N, corresponding to the illuminated light sources. As shown in FIG. 3, the light beams 26A–26C may be viewed by a human eye 48 or a computer eye 50 through the mounting locations 22A, 22B, and 22N, respectively. In this manner, a human or machine installer may easily discern the correct mounting locations 22A–22N for mounting hardware corresponding to the selected mounting pattern. According to one embodiment of the present invention, the rack-mount chassis 12 is positioned so that the mounting surface 8 upon which the printed circuit board 32 or other electronic component will be mounted is located proximate to the light sources 4A–4N. Therefore, according to this embodiment of the present invention, the rack-mount chassis 12 is inverted so that a human or machine installer may view the light sources 4A–4N through the bottom panel 20 of the rack-mount chassis 12.

Once the human or machine installer has identified the appropriate mounting locations 22A–22N, the installer may install mounting hardware in each of the mounting locations 22A–22N. According to an embodiment of the present invention, this may include inserting mounting hardware into each of the mounting holes in the rack-mount chassis 12. According to one embodiment of the invention, the mounting hardware may comprise screws or bolts. This procedure is illustrated in FIG. 4.

Figure 4:
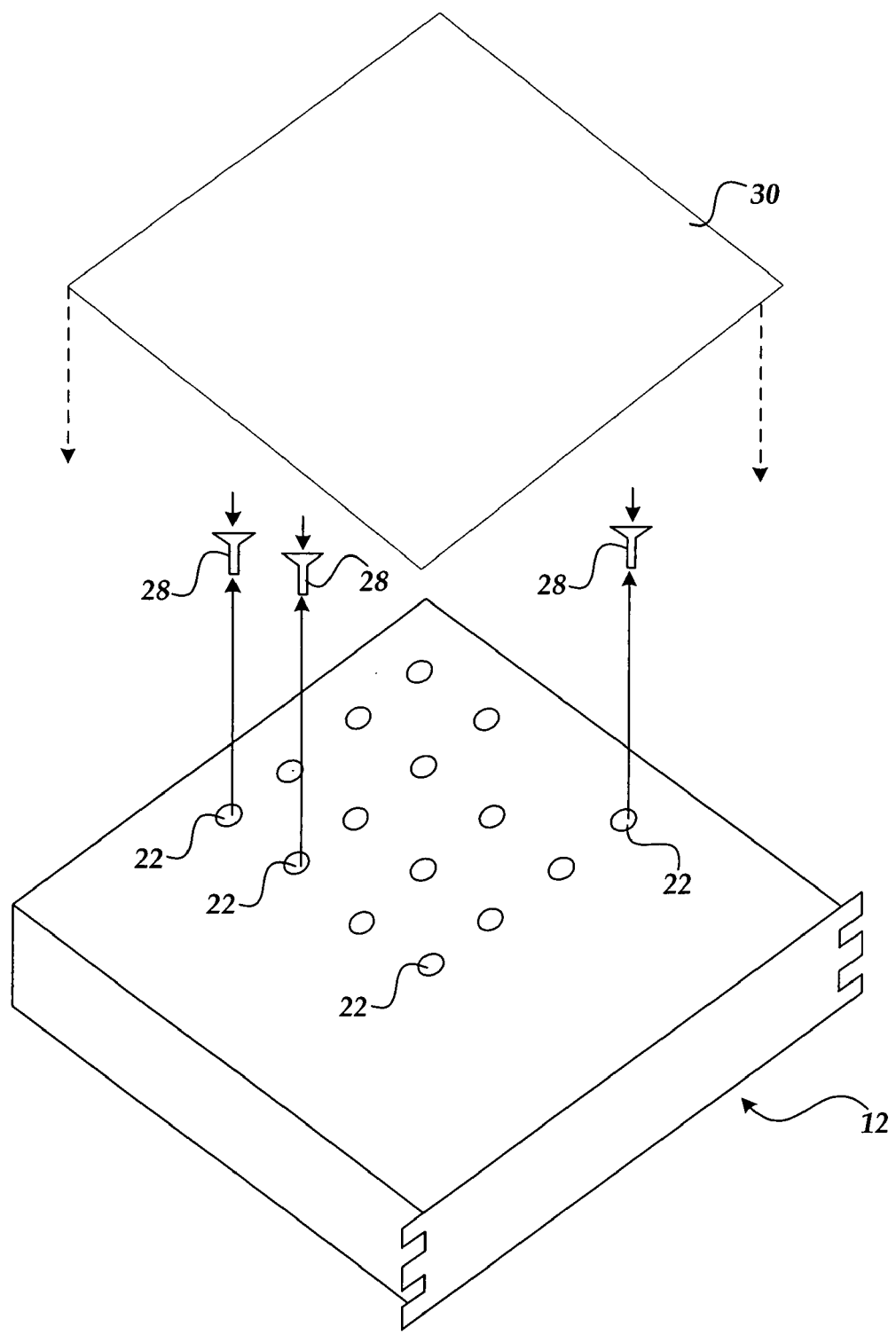
FIG. 4 is an isometric view showing a rack-mount chassis and a magnetic sheet utilized in one actual embodiment of the present invention.

As also shown in FIG. 4, once the mounting hardware 28 has been installed in each of the holes in the mounting surface 8 through which an illuminated light source 4A–4N is detected, a magnetic sheet 30 may be placed over the mounting hardware 28 and magnetically attached to the rack-mount chassis 12. In this manner, the mounting hardware 28 is removably attached to the rack-mount chassis 12 and will remain in place when the rack-mount chassis 12 is inverted to its normal upright position.

Figure 5:
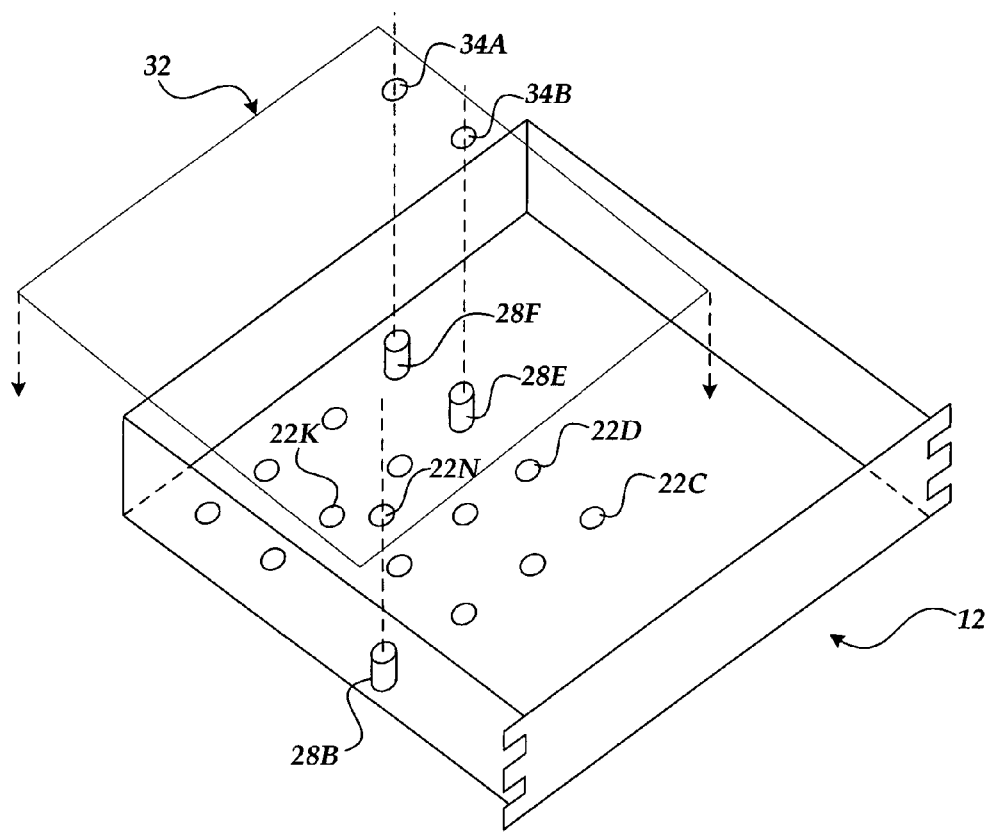
FIG. 5 is an isometric view showing the installation of a printed circuit board into a rack-mount chassis in one embodiment of the present invention.

As shown in FIG. 5, the rack-mount chassis 12 may be inverted to a normal upright position. In this position, the mounting hardware 28 protrudes through the mounting locations 22A–22N. In this position, a printed circuit board 32 or other type of electronic component may be positioned over the rack-mount chassis 12 so that the installed mounting hardware 28 is aligned with the corresponding mounting locations 34A–34B on the printed circuit board 32 or other type of electronic component. The printed circuit board 32 or other electronic component may then be positioned over the mounting hardware 28 and affixed to the rack-mount chassis 12 using additional mounting hardware, such as a nut. The magnetic sheet 30 may then be removed from the bottom panel 20 of the rack-mount chassis 12.

Figure 6:
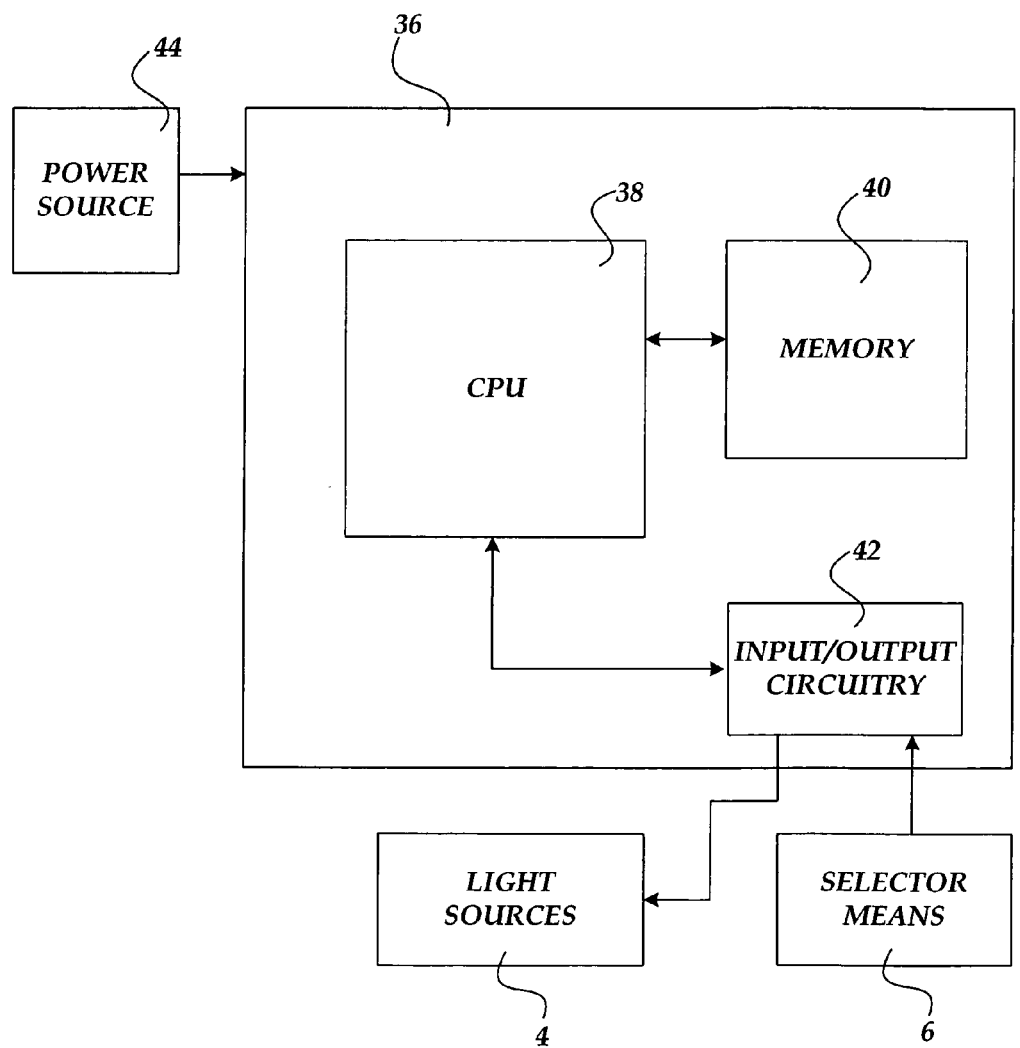
FIG. 6 is a block diagram showing hardware architecture for an apparatus provided according to one embodiment of the present invention.

Referring now to FIG. 6, an illustrative control means 36 will be described for controlling the operation of the apparatus 2. As shown in FIG. 6, the control means 36 comprises a central processing unit ("CPU") 38 for controlling the operation of the apparatus 2. In conjunction with the CPU 38, a memory 40 may be utilized for storing data identifying the light sources 4A–4N to be illuminated when each mounting pattern is selected with the selector means 6. In order to receive input from the selector means 6 at the CPU 38, input/output circuitry 42 may be utilized. Moreover, input/output circuitry 42 may also be utilized to provide an electrical interface for illuminating the light sources 4A–4N according to the various lighting patterns stored in the memory 40. The power source 44 provides electrical power to the control means 36 and the light sources 4A–4N. It should be appreciated by those skilled in the art that the apparatus 2 as described herein is controlled by a computer-operated control means 36. However, other types of control means 36 may be utilized, such as hardwired circuitry or other type of specialized hardware known to those skilled in the art.

Figure 7:
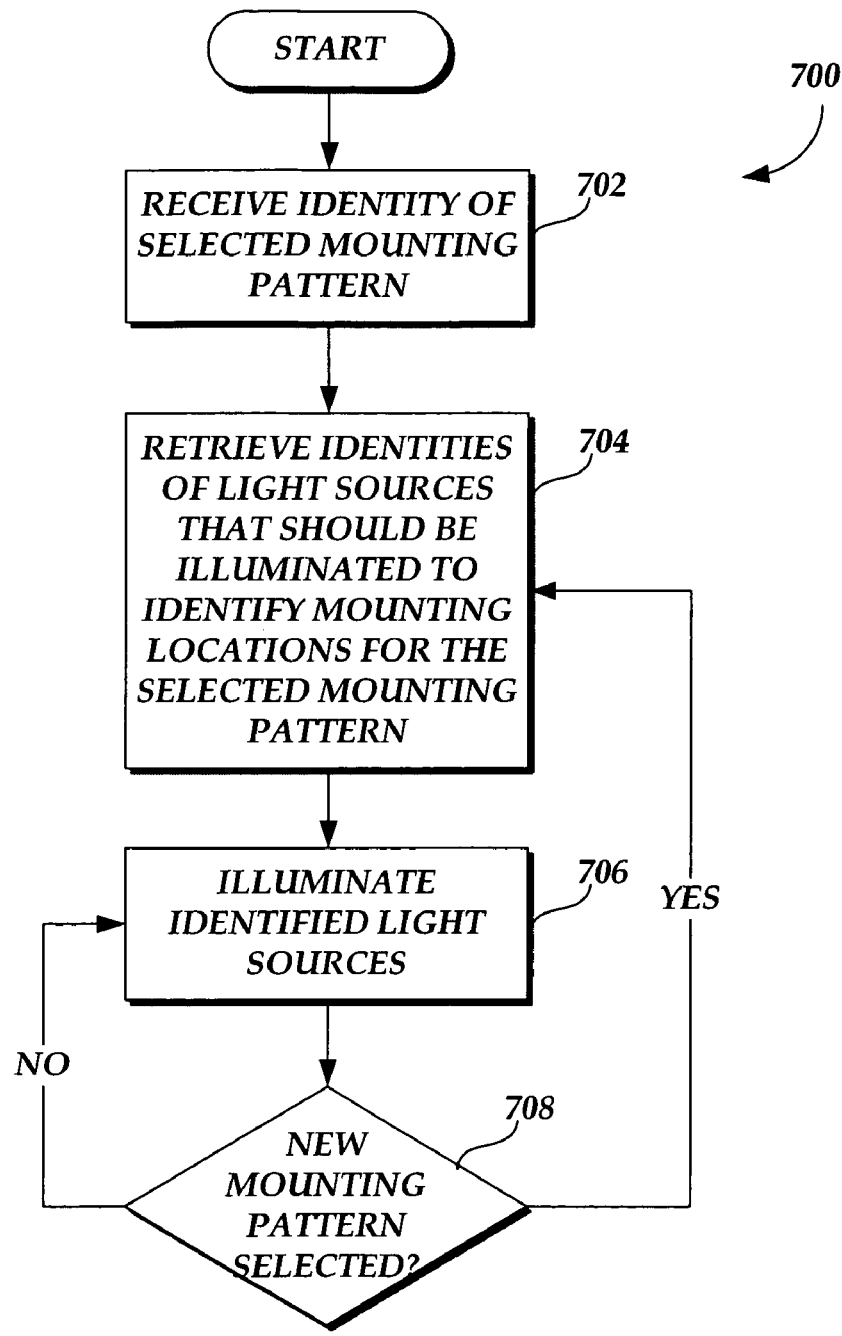
FIG. 7 is a flow diagram showing an illustrative routine for generating an illuminated mounting pattern for mounting a printed circuit board or other type of electronic component according to one embodiment of the present invention.

Referring now to FIG. 7, an illustrative routine 700 will be described for generating an illuminated mounting pattern 24A or 24B identifying one or more mounting locations 22A–22N for mounting a printed circuit board or other type of electronic component. The routine 700 begins at block 702 where the identity of a selected mounting pattern is received. As described above, a user may utilize the selector means 6 to identify a particular mounting pattern to be illuminated. Alternatively, the identity of the selected mounting pattern may be provided by another source, such as a computer program.

The routine 700 continues from block 702 to block 704, where the identities of the one or more light sources 4A–4N to be illuminated to identify the mounting locations 22A–22N for the selected mounting pattern are retrieved. In the embodiment of the invention wherein a computerized control means 36 is utilized, this may include retrieving from the memory 40 the identity of each light source 4A–4N to be illuminated.

From block 704, the routine 700 continues to block 706 where the identified light sources 4A–4N are illuminated. In order to illuminate the light sources 4A–4N, the CPU 38 may transmit signals to the input/output circuitry 42. The input/output circuitry 42 may then selectively provide electrical current to the light sources 4A–4N that should be illuminated for the selected mounting pattern.

From block 706, the routine 700 continues to block 708 where a determination is made as to whether a new mounting pattern has been selected utilizing the selector means 6. If a second mounting pattern has been selected, the routine 700 returns to block 704, where the identities of the one or more light sources 4A–4N that should be illuminated to identify the mounting locations 22A–22N for the second selected mounting pattern 24A or 24B are retrieved. The light sources illuminated for identifying the mounting locations for the selected mounting pattern are then extinguished and the light sources for identifying the mounting locations for the second selected mounting pattern are illuminated.

If, however, at block 708 it is determined that no new mounting pattern has been selected, the routine 700 returns to block 706. In this manner, the selected mounting pattern remains illuminated by the apparatus 2 until power is removed from the apparatus 2 or until another mounting pattern is selected.

Figure 8A:
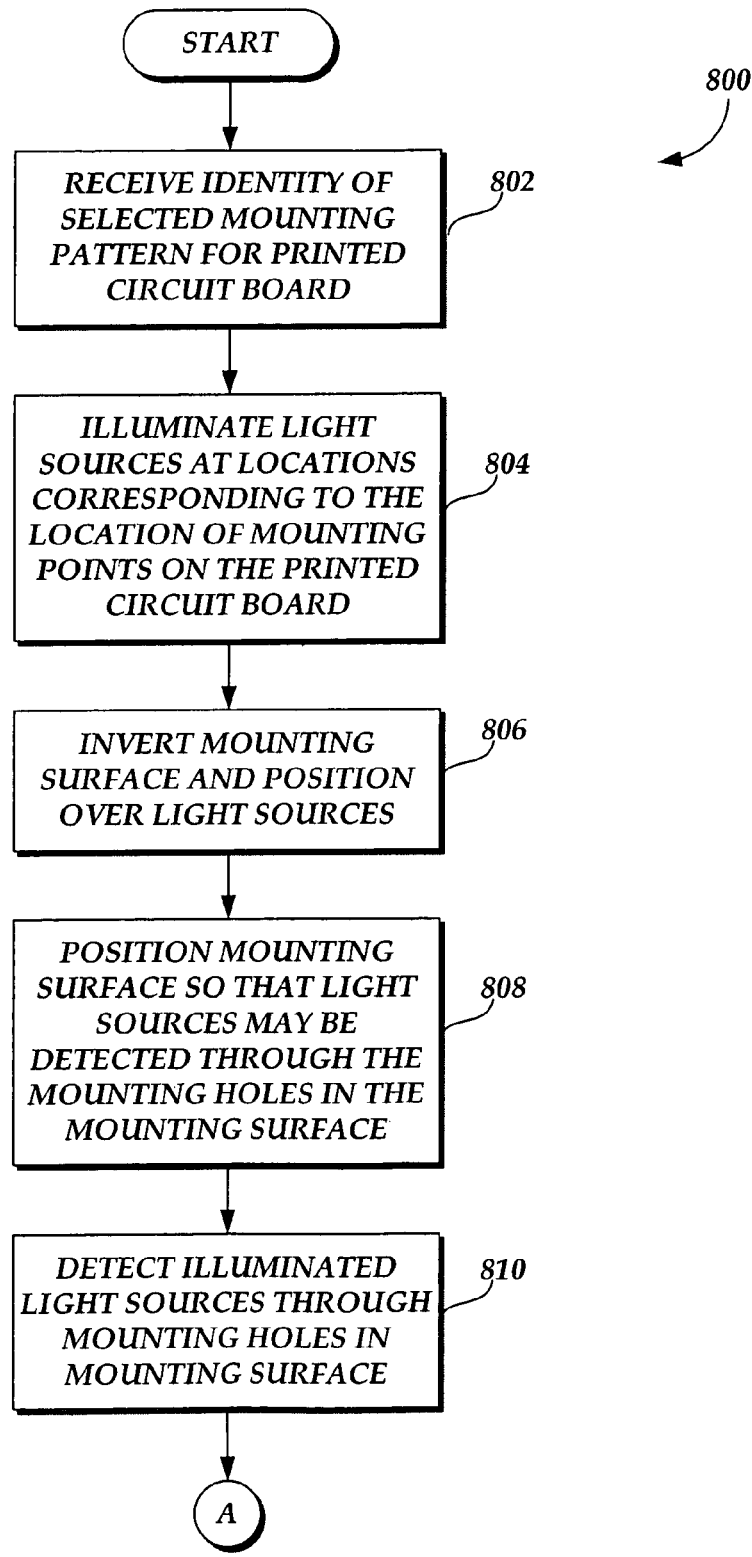
FIGS. 8A–8B are flow diagrams showing an illustrative routine for mounting a printed circuit board or other type of electronic component on a mounting surface according to one embodiment of the present invention.

Referring now to FIG. 8A, an illustrative routine 800 will be described for mounting a printed circuit board 32 or other type of electronic component having one or more mounting points 22A–22N on a mounting surface 8 having one or more mounting holes. The routine 800 begins at block 802, where the identity of the selected mounting pattern for the printed circuit board 32 or other type of electronic component to be mounted is received. As described above, the identity of the selected mounting pattern may be received through the selector means 6 or through instructions from a computer system. The routine 800 then continues from block 802 to block 804.

At block 804, the light sources 4A–4N located at the mounting locations 22A–22N corresponding to the location of the mounting points on the printed circuit board 32 or other type of electronic component are illuminated. This illumination occurs in the manner described above with respect to FIG. 7.

From block 804, the routine 800 continues to block 806 where the mounting surface 8 is inverted and positioned over the illuminated light sources 4A–4N. As described briefly above, according to one embodiment of the present invention, this comprises positioning the apparatus 2 below an inverted rack-mount chassis 12. The mounting surface 8 is then positioned so that the illuminated light sources 4A–4N may be detected through the mounting holes in the mounting surface 8 at block 808.

Figure 8B:
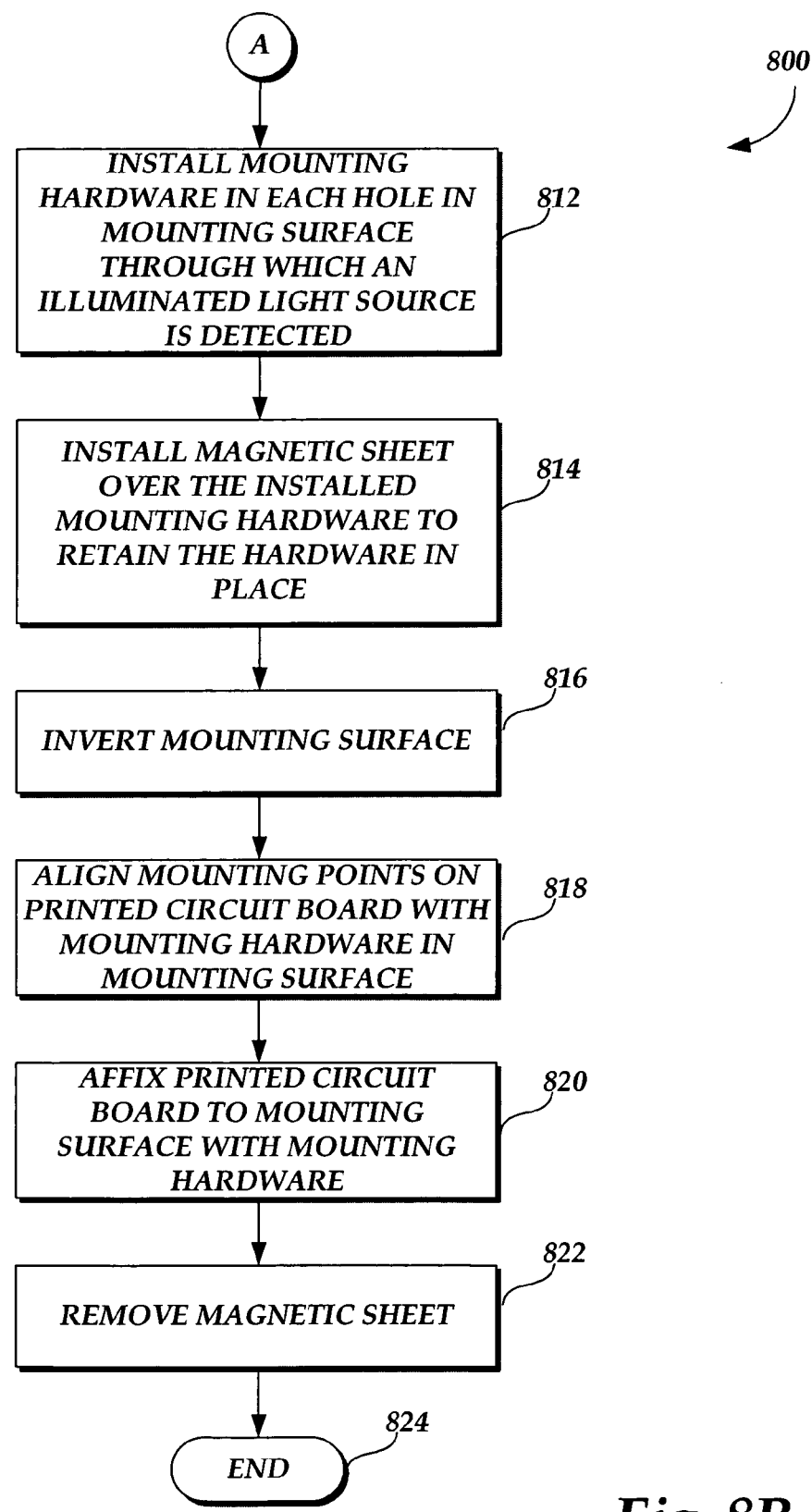

At block 810, the illuminated light sources 4A–4N are detected through the mounting holes in the mounting surface 8. The detection may occur by a human installer or through the use of a computer eye 50. The routine 800 then continues to block 812, shown in FIG. 8B, where mounting hardware 28 is installed in each hole in the mounting surface 8 through which an illuminated light source is detected. The mounting hardware 28 may be installed by a human installer or by a machine. According to one embodiment of the invention, installing the mounting hardware 28 comprises placing a screw in each of the mounting holes through which an illuminated light source 4A–4N is detected.

From block 812, the routine 800 continues to block 814, where a magnetic sheet 30 is installed over the mounting hardware 28 installed in the mounting surface 8 to retain the mounting hardware 28 in place. The magnetic sheet 30 is magnetically attached to the mounting surface 8 and thereby retains the mounting hardware 28.

The routine 800 then continues from block 814 to block 816, where the mounting surface 8 is inverted into an upright position. The printed circuit board 32 or other type of electronic component to be mounted may then be aligned with the mounting hardware 28 in the mounting surface 8 at block 818. Particularly, mounting points contained on the printed circuit board 32 are aligned with the mounting hardware 28 protruding from the mounting surface 8.

The printed circuit board 32 or other type of electronic component may then be placed proximate to the mounting hardware 28 and affixed to the mounting surface 8 with additional mounting hardware 28, such as a bolt at block 820. Once this has been accomplished, the magnetic sheet 30 may be removed from the mounting surface 8 at block 822. The routine 800 then continues to block 824, where it ends.

Based on the foregoing, it should be appreciated that the embodiments of the present invention provide methods and apparatus for mounting printed circuit boards or other types of electronic components. The above specification, examples and data provide a complete description of the manufacture and use of the composition of the invention. It is to be understood that the invention defined in the appended claims is not necessarily limited to the specific structures, acts or medium described. Therefore, the specific structural features, acts and mediums are disclosed as illustrative embodiments implementing the claimed invention. Since many embodiments of the invention can be made without departing from the spirit and scope of the invention, the invention resides in the claims hereinafter appended.

I claim:

1. An apparatus for identifying a desired mounting pattern for mounting a printed circuit board to a chassis from a plurality of mounting patterns, said apparatus comprising:
   a mounting surface;
   a plurality of light sources mounted on the mounting surface at positions corresponding to the mounting patterns, wherein each of the patterns defines mounting locations such that the mounting locations correspond to standard mounting locations positioned on the chassis; a control means for controlling the illumination of said one or more light sources; and a selector means connected to control logic, said selector means having one or more selectable positions, each of said selectable positions corresponding to one or more mounting patterns; and wherein said plurality of light sources are illuminated so that only light sources corresponding to mounting locations defined by the standard mounting locating for the desired mounting pattern are illuminated.

2. The apparatus of claim 1, wherein said control means comprises a memory for storing data identifying the light sources to be illuminated when each of said mounting patterns is selected with said selector means.

3. The apparatus of claim 2, further comprising a power source for providing power to said control means and to said light sources.

4. The apparatus of claim 3, wherein said power source comprises a rechargeable power source.

5. An apparatus for identifying a desired mounting pattern for mounting a printed circuit board to a chassis from a plurality of mounting patterns, said apparatus comprising:

a mounting surface having a plurality of light sources mounted thereon in locations corresponding to said mounting patterns, wherein each of the mounting patterns defines mounting locations such that the mounting locations correspond to standard mounting locations positioned on the chassis;

a selector means for selecting the desired mounting pattern such that only light sources corresponding to the desired mounting pattern according to mounting locations are selectively illuminated; and a power source for providing power to said light sources.

6. The apparatus of claim 5, further comprising:

a control means for receiving the selection of the desired mounting pattern from said selector means and for delivering power from said power source to each of said light sources defined by the selected mounting pattern.

* * * * *